United States Patent
Hajaj et al.

(10) Patent No.: US 11,676,909 B2
(45) Date of Patent: Jun. 13, 2023

(54) METROLOGY TARGETS FOR HIGH TOPOGRAPHY SEMICONDUCTOR STACKS

(71) Applicant: KLA Corporation, Milpitas, CA (US)

(72) Inventors: Eitan Hajaj, Tel Aviv (IL); Yoav Grauer, Haifa (IL)

(73) Assignee: KLA Corporation, Milpitas, CA (US)

( * ) Notice: Subject to any disclaimer, the term of this patent is extended or adjusted under 35 U.S.C. 154(b) by 275 days.

(21) Appl. No.: 16/770,241

(22) PCT Filed: May 5, 2020

(86) PCT No.: PCT/US2020/031398
§ 371 (c)(1),
(2) Date: Jun. 5, 2020

(87) PCT Pub. No.: WO2021/225579
PCT Pub. Date: Nov. 11, 2021

(65) Prior Publication Data
US 2022/0020695 A1   Jan. 20, 2022

(51) Int. Cl.
*H01L 23/544* (2006.01)
*H01L 21/66* (2006.01)

(52) U.S. Cl.
CPC ............ *H01L 23/544* (2013.01); *H01L 22/12* (2013.01); *H01L 2223/54426* (2013.01)

(58) Field of Classification Search
CPC ......... H01L 23/544; H01L 2223/54426; B81C 99/007; G03F 7/70683; G03F 7/70633
See application file for complete search history.

(56) References Cited

U.S. PATENT DOCUMENTS

| | | | |
|---|---|---|---|
| 8,361,683 B2 | 1/2013 | Ausschnitt et al. | |
| 2012/0033215 A1* | 2/2012 | Kandel | G03F 7/70633 356/366 |
| 2013/0163852 A1 | 6/2013 | Ghinovker | |

FOREIGN PATENT DOCUMENTS

| | | |
|---|---|---|
| KR | 20080051347 A | 6/2008 |
| KR | 101257961 B1 | 4/2013 |

OTHER PUBLICATIONS

WIPO, ISR for PCT/US2020/031398, Feb. 3, 2021.

\* cited by examiner

*Primary Examiner* — Amar Movva
(74) *Attorney, Agent, or Firm* — Hodgson Russ LLP

(57) ABSTRACT

A metrology target for use in measuring misregistration between layers of a semiconductor device including a first target structure placed on a first layer of a semiconductor device, the first target structure including a first plurality of unitary elements respectively located in at least four regions of the first target structure, the first plurality of elements being rotationally symmetric with respect to a first center of symmetry and at least a second target structure placed on at least a second layer of the semiconductor device, the second target structure including a second plurality of elements respectively located in at least four regions of the second target structure, the second plurality of elements being rotationally symmetric with respect to a second center of symmetry, the second center of symmetry being designed to be axially aligned with the first center of symmetry and corresponding ones of the second plurality of elements being located adjacent corresponding ones of the first plurality of elements in the at least four regions in a non-surrounding arrangement, when the first and second layers are placed one on top of another.

20 Claims, 7 Drawing Sheets

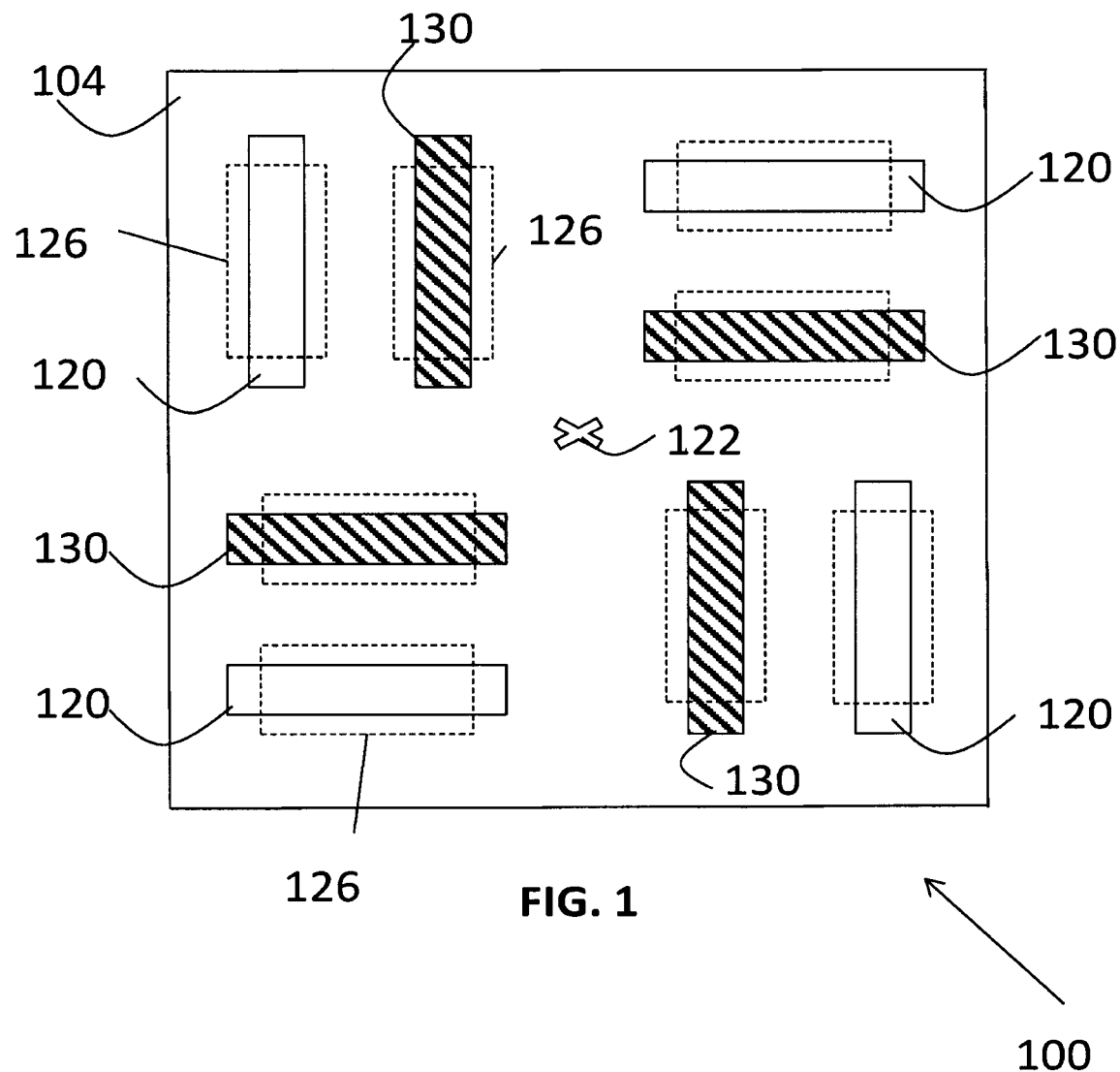

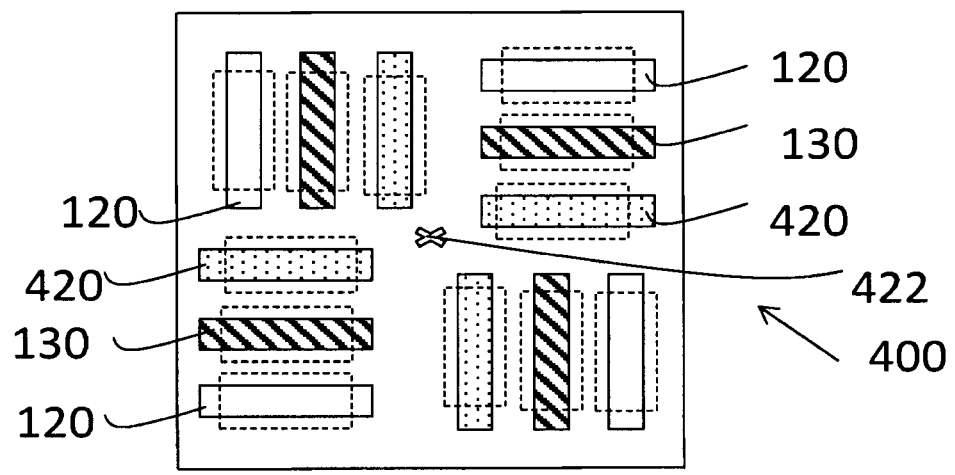
FIG. 4
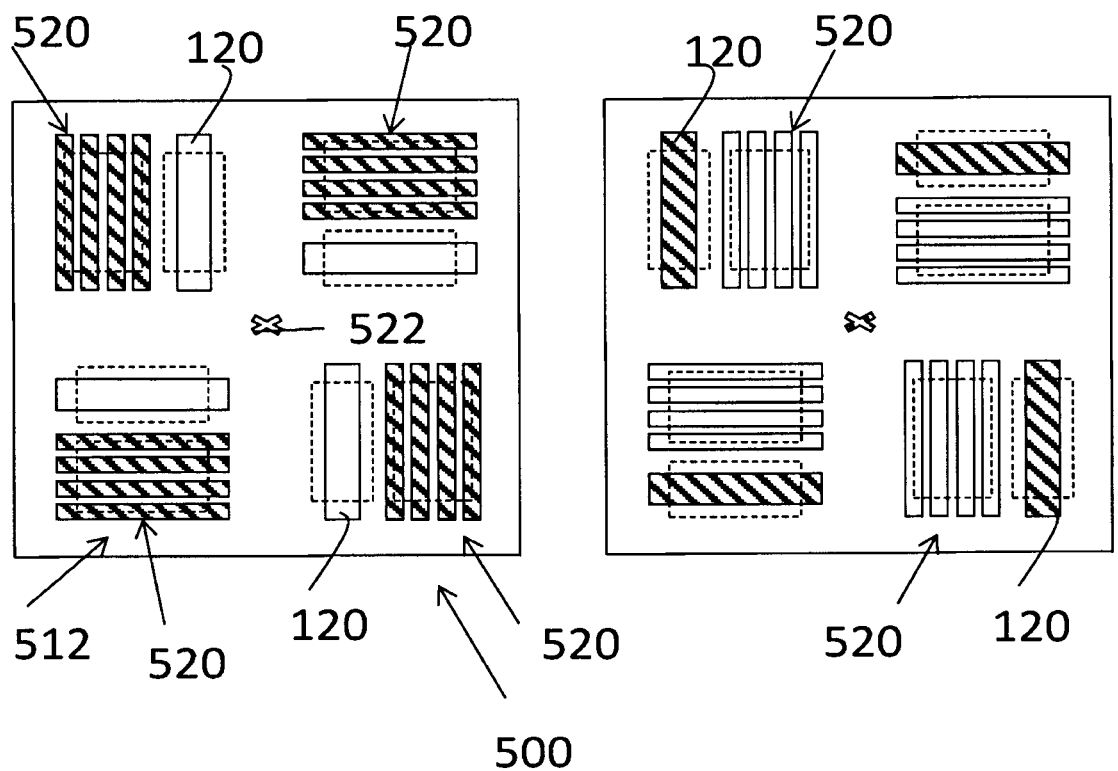
FIG. 5A
FIG. 5B

METROLOGY TARGETS FOR HIGH TOPOGRAPHY SEMICONDUCTOR STACKS

FIELD OF THE INVENTION

The present invention relates generally to metrology and more particularly to metrology targets useful for measurement of misregistration in the manufacture of semiconductor devices.

BACKGROUND OF THE INVENTION

Various types of metrology targets are known in the art.

SUMMARY OF THE INVENTION

The present invention seeks to provide novel metrology targets particularly useful for the measurement of misregistration between layers of high topography semiconductor stacks.

There is thus provided in accordance with a preferred embodiment of the present invention a metrology target for use in measuring misregistration between layers of a semiconductor device including a first target structure placed on a first layer of a semiconductor device, the first target structure including a first plurality of unitary elements respectively located in at least four regions of the first target structure, the first plurality of elements being rotationally symmetric with respect to a first center of symmetry and at least a second target structure placed on at least a second layer of the semiconductor device, the second target structure including a second plurality of elements respectively located in at least four regions of the second target structure, the second plurality of elements being rotationally symmetric with respect to a second center of symmetry, the second center of symmetry being designed to be axially aligned with the first center of symmetry and corresponding ones of the second plurality of elements being located adjacent corresponding, ones of the first plurality of elements in the at least four regions in a non-surrounding arrangement, when the first and second layers are placed one on top of another.

Preferably, the first plurality of unitary elements includes non-periodic elements.

Preferably, the second plurality of elements includes unitary, non-periodic elements.

Preferably, the first and second pluralities of elements include bar-like elements, each having a length dimension greater than a width dimension.

Preferably, each element of the first and second pluralities of elements is invariant upon 180° rotation thereof.

Preferably, the length dimension and the width dimension of the first plurality of elements is similar to the length dimension and the width dimension of the second plurality of elements.

In accordance with one preferred embodiment of the present invention, the second plurality of elements includes periodic elements.

In accordance with another preferred embodiment of the present invention, the metrology target also includes a third target structure placed on a third layer of the semiconductor device, the third target structure including a third plurality of elements respectively located in at least four regions of the third target structure, the third plurality of elements being rotationally symmetric with respect to a third center of symmetry, the third center of symmetry being designed to be aligned with the first and second centers of symmetry and corresponding ones of the third plurality of elements being located adjacent corresponding ones of the first and second pluralities of elements in the at least four regions in a non-surrounding arrangement, when the first, second and third layers are placed one on top of another.

Preferably, the four regions are mutually uniformly sized.

Alternatively, the four regions are not mutually uniformly sized.

There is also provided in accordance with another preferred embodiment of the present invention a method for measuring misregistration between layers of a semiconductor device including providing a first target structure on a first layer of a semiconductor device, the first target structure including a first plurality of unitary elements respectively located in at least four regions of the first target structure, the first plurality of elements being rotationally symmetric with respect to a first center of symmetry, providing at least a second target structure placed on at least a second layer of the semiconductor device, the second target structure including a second plurality of elements respectively located in at least four regions of the second target structure, the second plurality of elements being rotationally symmetric with respect to a second center of symmetry, placing the first and second layers one upon another, such that the second center of symmetry is designed to be axially aligned with the first center of symmetry and corresponding ones of the second plurality of elements are located adjacent corresponding ones of the first plurality of elements in the at least four regions in a non-surrounding arrangement, and performing metrology on the first and second target structures, in order to measure misregistration between the first and second layers.

Preferably, the first plurality of unitary elements includes non-periodic elements.

Preferably, the second plurality of elements includes unitary, non-periodic elements.

Preferably, the first and second pluralities of elements, include bar-like elements, each having a length dimension greater than a width dimension.

Preferably, each element of the first and second pluralities of elements is invariant upon 180° rotation thereof.

Preferably, the length dimension and the width dimension of the first plurality of elements is similar to the length dimension and the width dimension of the second plurality of elements.

In accordance with a preferred embodiment of the method of the present invention, the second plurality of elements includes periodic elements.

In accordance with another preferred embodiment of the method of the present invention, the method also includes providing a third target structure on a third layer of the semiconductor device, the third target structure including a third plurality of elements respectively located in at least four regions of the third target structure, the third plurality of elements being rotationally symmetric with respect to a third center of symmetry, and placing the third layer upon the first and second layers such that the third center of symmetry is designed to be aligned with the first and second centers of symmetry and corresponding ones of the third plurality of elements are located adjacent corresponding ones of the first and second pluralities of elements in the at least four regions in a non-surrounding arrangement.

Preferably, the four regions are mutually uniformly sized.

Alternatively, the four regions are not mutually uniformly sized.

BRIEF DESCRIPTION OF THE DRAWINGS

The present invention will be understood and appreciated more fully from the following detailed description, taken in conjunction with the drawings in which:

FIG. 1 is a simplified schematic top view illustration of a metrology target constructed and operative in accordance with a preferred embodiment of the present invention;

FIG. 4 is a simplified schematic top view illustration of a triple layer metrology target, constructed and operative in accordance with another preferred embodiment of the present invention;

FIGS. 5A and 5B are simplified schematic top view illustrations of additional, respective partially periodic metrology targets, constructed and operative in accordance with still another preferred embodiment of the present invention;

DETAILED DESCRIPTION OF PREFERRED EMBODIMENTS

Figure 2A:
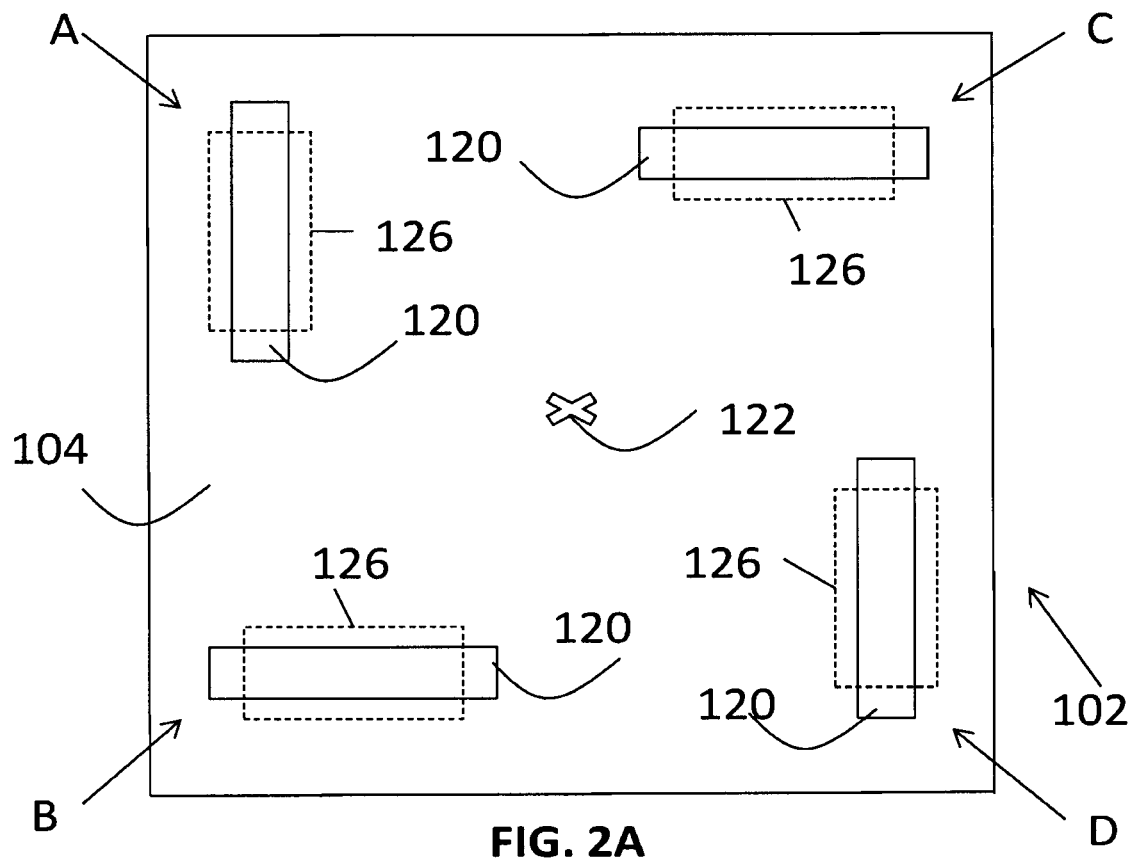
FIGS. 2A and 2B are simplified schematic top view illustrations of respective first and second target structures forming the metrology target of FIG. 1 when fixedly placed one upon another.
Figure 2B:
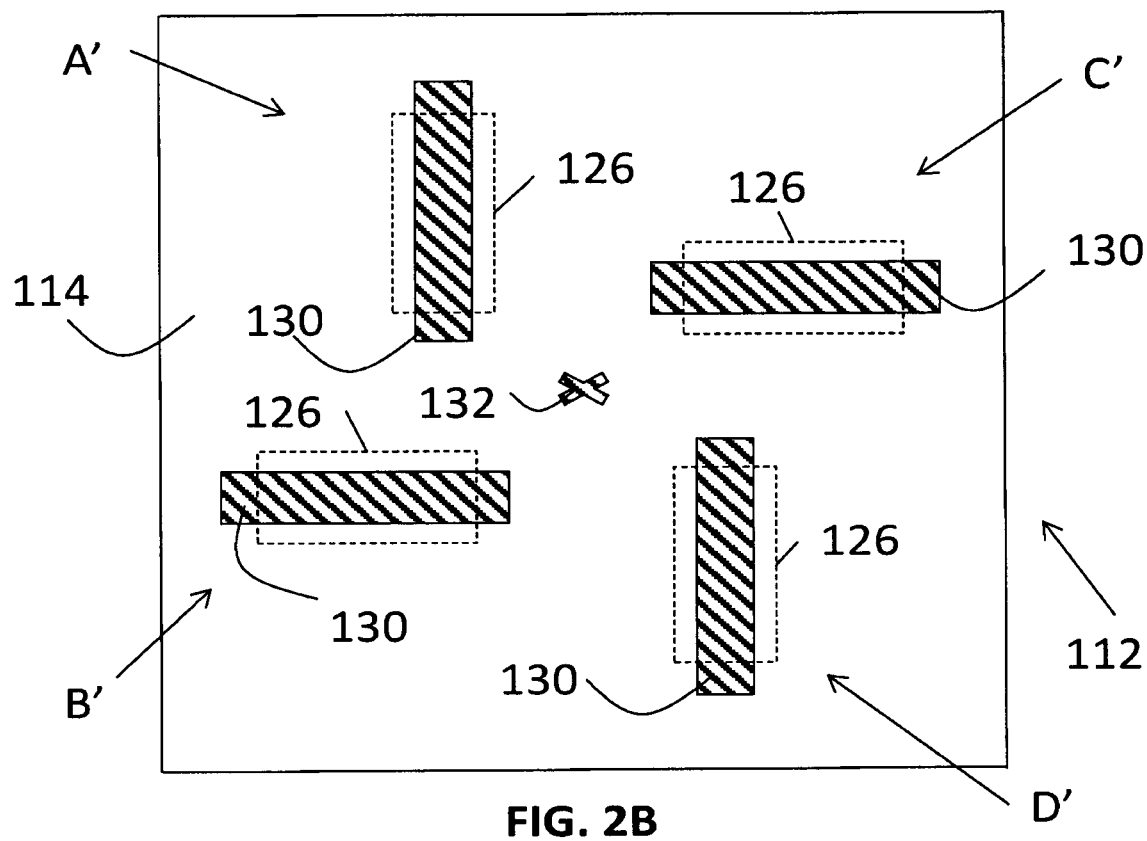

Reference is now made to FIG. 1, which is a simplified schematic top view illustration of a metrology target constructed and operative in accordance with a preferred embodiment of the present invention; and to FIGS. 2A and 2B, which are simplified schematic top view illustrations of respective first and second target structures forming the metrology target of FIG. 1 when fixedly placed one upon another.

As seen in FIGS. 1-2B, there is provided a metrology target 100, preferably including a first target structure 192 formed on a first layer 104 of a semiconductor device and at least a second target structure formed on at least a second layer of the semiconductor device, here embodied, by way of example, as a second target structure 112 formed on a second layer 114. FIG. 2A shows first target structure 102 formed on first layer 104 and FIG. 2B shows second target structure 112 formed on second layer 114. It is understood that the target 100 shown in FIG. 1 corresponds to the combined structure formed by first and second target structures 102 and 112 when first and second layers 104 and 114 are fixedly placed one upon the other. First layer 104 may be placed on second layer 114, such that first target structure 102 is disposed upon second target structure 112. Alternatively, second layer 114 may be placed on first layer 104, such that second target structure 112 is disposed upon first target structure 102. In the following description first layer 104 will be described as the upper layer disposed on second layer 114, although it is appreciated that the reverse is also possible.

Irrespective of the relative layered arrangement of first and second layers 104 and 114, the two layers 104 and 114 and hence the target structures 102 and 112 thereon are preferably disposed in a fixed position with respect to each other, such that metrology may be performed upon metrology target 100 in order to measure possible misregistration between layers 104 and 114, as is further detailed henceforth. In accordance with a particularly preferred embodiment of the present invention, at least one of first and second layers 104 and 114 are embodied as high or thick topography layers of a semiconductor device, metrology target 100 being particularly well suited for measuring misregistration between, such layers due to various features thereof detailed henceforth.

By way of non-limiting example, first and second layers 104 and 114 may be consecutive staircase layers, deck-to-deck layers, contact to bit line layers or word-line to bit-line layers of a 3D NAND semiconductor device; may be consecutive storage node alignment layers of a DRAM semiconductor device; may be consecutive BEOFL thick alignment layers of a FOUNDRY/LOGIC semiconductor device; may be consecutive thick alignment layers of a 3DSXP semiconductor device; or may be thick alignment layers of an Emerging Memory semiconductor device. Additionally, first and second layers 104 and 114 may be embodied as consecutive wafer layers in wafer-to-wafer stacking or consecutive layers of wafer and die in die-to-wafer stacking.

First target structure 102 is preferably formed by a first plurality of elements 120 preferably having second order rotational symmetry with respect to a first rotational center of symmetry 122. Elements 120 are preferably unitary, non-periodic elements, here shown to each have a bar-like shape. Preferably, each of elements 120 has a length dimension greater than a width dimension thereof. Each of elements 120 preferably in itself possesses at least second order rotational symmetry, such that each element 120 is invariant upon 180° rotation thereof. Elements 120 are preferably located in at least four regions of target structure 102, here indicated as regions A, B, C and D. A measurement region of interest (ROI) 126 may be defined with respect to each of elements 120. ROI 126 corresponds to the region associated with each element 120 over which a signal is measured for the purpose of metrology. It is appreciated that ROIs 126 may be manually defined by a user of the metrology tool or may be automatically defined by algorithms, possibly including machine learning algorithms, included in the metrology tool.

Second target structure 112 is preferably formed by a second plurality of elements 130 preferably having second order rotational symmetry with respect to a second rotational center of symmetry 132. Elements 130 are here shown, by way of example only, as unitary, non-periodic elements, having a bar-like shape, although it is appreciated that elements 130 may alternatively be periodic elements, as is described in greater detail henceforth with reference to FIGS. 5A and 5B. Preferably, each of elements 130 has a length dimension greater than a width dimension thereof. Each of elements 130 preferably in itself possesses at least second order rotational symmetry, such that each element 130 is invariant upon 180° rotation thereof. Elements 130 are preferably located in at least four regions of target structure 112, here indicated as regions A', B', C' and D'. Measurement ROIs 126 may additionally be defined with respect to each of elements 130.

For ease of analysis of signals measured from ROIs 126 associated with first and second elements 120 and 130, first and second elements 120 and 130 are preferably similarly sized and preferably differ in length and/or width by less than a factor of two. Furthermore, regions A, B, C, D and A', B',C' and D' are preferably, although not necessarily, mutually uniformly sized.

First and second target structures 102 and 112 may be produced on respective layers 104 and 114 by any suitable patterning techniques, such as by lithography. An example of a lithography tool suitable for producing first and second target structures 102 and 112 on layers of a semiconductor device is a TWINSCAN deep ultraviolet (DUV) immersion lithography system, commercially available from ASML of Veldhoven, Netherlands. Any convenient orientation of first and second target structures 102 and 112 relative to the placement of dies on layers 104 and 114 may be chosen, with that orientation being maintained from layer to layer. By way of example, target structures 102 and 112 may be located within the scribe line between dies and/or within dies.

As seen in FIG. 1, when first and second layers 104 and 114 are placed one upon another, for example when first layer 104 is placed upon second layer 114, second layer 114 is preferably, although not necessarily, at least partially visible through first layer 104. Uppermost elements 120 located on first layer 104 are shown as blank elements and lower elements 130 located on second layer 114 are shown as hatched elements, in order to distinguish between elements 120 and 130 residing on different layers. It is appreciated that first and second layers need not directly contact one another and other intervening layers may be present therebetween.

When first and second layers 104 and 114 are placed one upon another, first and second centers of symmetry 122 and 132 are designed to be in axial alignment, such that first and second centers of symmetry 122 and 132 lie along a common axis generally orthogonal to a direction of layering of first and second layers 104 and 114 and to a direction of measurement. Furthermore, corresponding ones of plurality of elements 120 are preferably located adjacent to but not surrounding corresponding ones of plurality of elements 130 in the at least four regions of each of the first and second target structures 102 and 112. As seen in FIG. 1, by way of example, when first layer 104 is placed upon second layer 114 in perfect alignment, centers of symmetry 122 and 132 axially coincide. Additionally, regions A, A'; B, B'; C, C' and D, D' each respectively overlap, such that element 120 located in region A is located adjacent to element 130 located in region A', element 120 located in region B is located adjacent to element 130 located in region B' and so forth, elements 120 being in a non-surrounding arrangement with respect to elements 130 when viewed from a direction generally orthogonal to the direction of layering of layers 104 and 114.

In the performance of metrology on a semiconductor device including metrology target 100, metrology target 100 is preferably imaged by a metrology tool. An example of a metrology tool suited for the imaging of metrology target 100 is an Archer optical imaging metrology tool, commercially available from KLA of California, USA. It is appreciated however, that targets of the present invention may be imaged by any suitable optical metrology tool operating within a wavelength range of approximately a 350-2,500 nm.

The metrology tool is preferably operative to measure signals arising from each ROI 126 associated with each of elements 120 and 130 and to find misregistration between layers 104 and 114 of the semiconductor device based on measurement of misregistration between target structures 102 and 112. The metrology tool may be operative to perform measurements on upper and lower consecutive layers simultaneously or consecutively. The metrology tool may further be operative to simultaneously perform measurements on multiple one of the targets of the present invention in the field of view thereof. The metrology tool may additionally or alternatively be operative to combine misregistration data obtained based on measurements of multiple ones of the targets of the present invention, in order to improve estimation of the total measurement uncertainty (TMU).

It is appreciated that multiple ones of the targets of the present invention located on a semiconductor wafer may differ with respect to each other across the semiconductor wafer or across a field of the semiconductor wafer. For example, multiple ones of the target of the present invention may differ with respect to each other across the wafer or field of the wafer in terms of the design or dimensions thereof. Furthermore, a group or collection of targets of the present invention having mutually different dimensions or other characteristics may be located on a semiconductor wafer in close proximity to each other, in order to improve measurement of misregistration based thereon. For example, misregistration measurements derived based on metrology performed on a group of closely spaced mutually differently sized targets of the present invention may be more robust and accurate than misregistration measurements derived based on a single target or group of identical targets.

It is appreciated that the metrology tool may perform metrology with different settings per layer as well as different settings per direction of target, such as vertical and horizontal directions. Examples of different metrology settings that may be applied per layer and/or per target direction include different wavelength of illumination, different polarization of illumination, different focus, different illumination NA and different collection NA.

Particularly preferably, misregistration between target structures 102 and 112 may be ascertained based on an offset between the derived location of first and second centers of symmetry 122 and 132. As mentioned hereinabove, first and second centers of symmetry 122 and 132 are designed to be mutually axially aligned when first and second layers 104 and 114 are properly disposed with respect to each other, such that any offset in the relative positions of first and second centers of symmetry 122 and 132 is indicative of misregistration between first and second target structures 102 and 112 and by extension between first and second layers 104 and 114. Methods for the ascertaining of misregistration based on offset between centers of symmetry of target patterns are well known in the art and may be applied to the metrology targets of the present invention by one skilled in the art.

It is appreciated that the formation of each of target structures 102 and 112 from a plurality of individual elements distributed between various regions thereof in mutually non-surrounding arrangement provides high coverage of the target area defined by target 100. This allows signal to be measured by the metrology tool over a significantly sized combined ROI formed of ROIs 126 for each target structure, leading to an improved signal-to-noise (SNR) ratio in the metrology output. Furthermore, since elements 120 and 130 of the two target structures 102 and 112 are similarly sized with similarly sized ROIs 126, similar levels of noise averaging may be applied to both of the target structures 102 and 112 in both of upper and lower layers 104 and 114.

Elements 120 and 130 may be arranged to allow good coverage by ROIs 126 of the target area without causing mixing of signals arising from ROIs 126 of first and second target structures 102 and 112. Such mixing of signals would lead to inaccuracies in the misregistration measurements derived based on target 100. This is in contrast to conventional target structures, such as a Box-in-Box and Bar-in-Bar target designs in which an inner box-like target structure formed on one layer is concentrically surrounded by an outer box-like target structure formed on another consecutive layer. In such target designs, in order to maintain signal isolation between signals arising from ROIs associated with the different layers, the inner box-like target structure is typically reduced in size, leading to a reduction in the ROI associated therewith and corresponding reduction in signal measured therefrom. Advantageously, no such trade-off is required in the present invention, since a relatively large ROI coverage of the target structure of each layer may be maintained without causing signal mixing therebetween. This is particularly advantageous for high topography stacks, where such signal mixing may otherwise significantly degrade the accuracy of misregistration measurements, due to the high topography of the various layers. By way of example, this may be particularly advantageous for layers having topographical features of height greater than 4 um or greater than 5 um.

Furthermore, in contrast to, the conventional Box-in-Box target design in which the inner target box is required to be concentrically surrounded by the outer target box, in the target design of the present invention elements 120 of first target structure 102 do not completely surround elements 130 of second target structure 112. The target design of the present invention thus allows greater flexibility in the relative layout of elements is 120 and 130. This is particularly advantageous for high topography stacks, in which each of plurality of elements 120 and 130 may be required to be themselves separated by a given minimum separation. Similarly, the target design of the present invention is advantageous in this sense over periodic targets, such as conventional Advanced Imaging Metrology (AIM) targets. Since target elements formed on high topography layers may require mutual separation by a minimum distance, such conventional periodic targets are typically poorly suited for formation on such high topography layers, as the periodic features thereof cannot be formed with the required periodicity.

Preferably, the arrangement of elements 120 and 130 of first and second target structures 102 and 112 respectively, allows for the separate calculation of the center of symmetry in horizontal and vertical directions for each of first and second target structures 102 and 112. Any errors in ascertainment of the location of the center of symmetry in one direction, for example in the vertical direction, thus do not influence the ascertainment of the location of the center of symmetry in another direction, for example in the horizontal direction. This is in contrast to certain conventional metrology targets formed by two-dimensional features formed on consecutive layers and located in opposite diagonals of the target area when the layers are placed one upon another, for which conventional targets centers of symmetry in both directions are simultaneously ascertained and errors in one direction thus affect errors in the other direction.

Figure 3A:
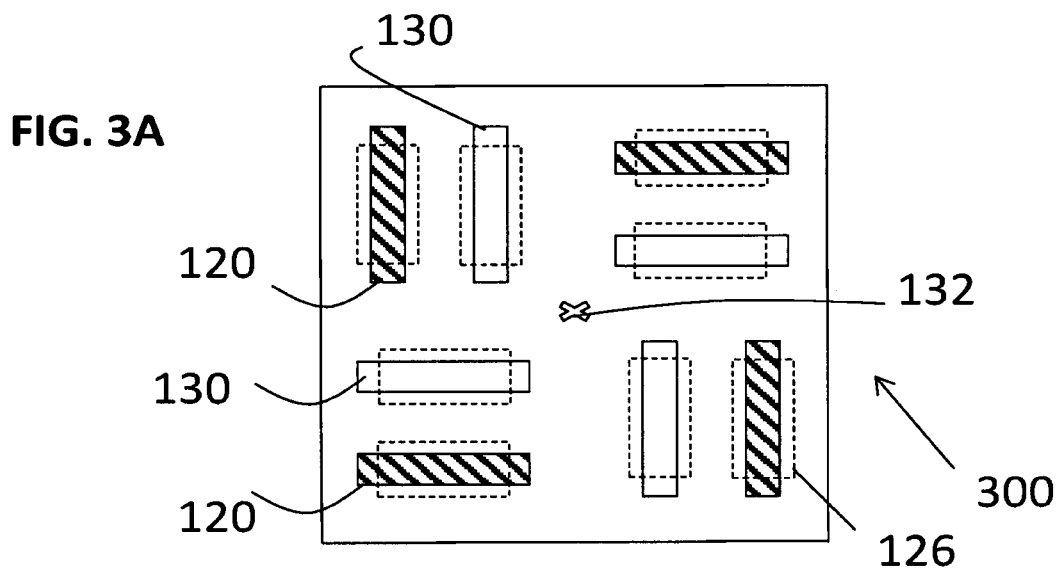
FIGS. 3A, 3B and 3C are simplified schematic top view illustrations of respective metrology targets, constructed and operative, in accordance with additional preferred embodiments of the present invention.
Figure 3B:
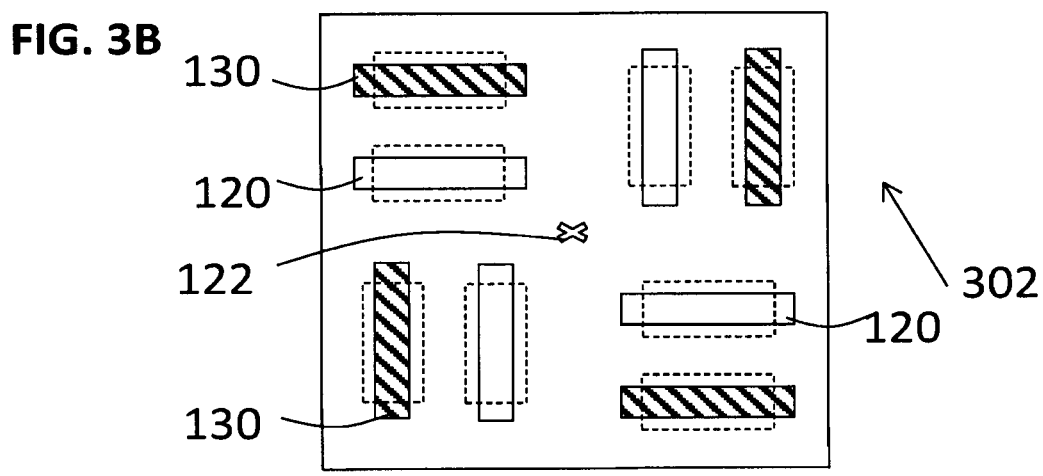
Figure 3C:
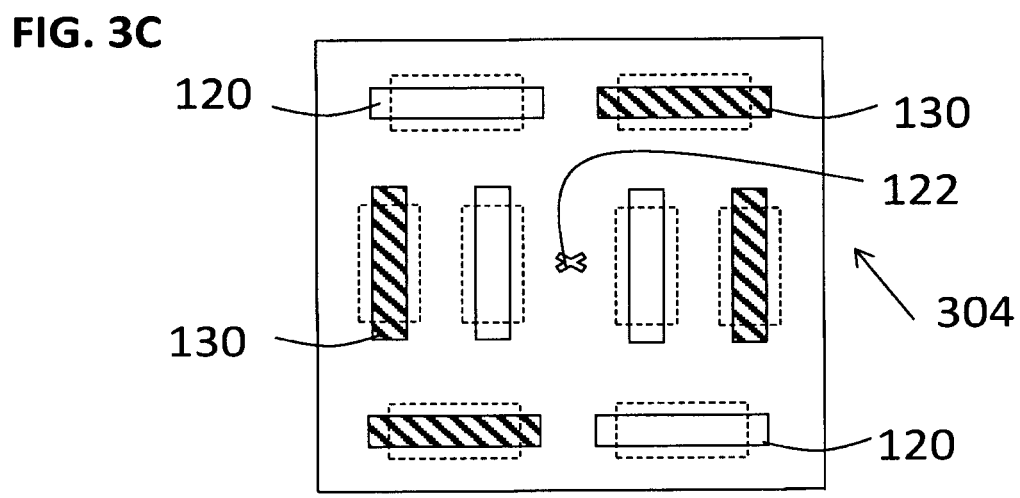

It is appreciated that the particular arrangement of elements 120 and 130 of first and second target structures 102 and 112 shown in FIGS. 1-2B is exemplary only and that a great variety of other arrangements of elements to form targets constructed and operative in accordance with the present invention are possible. Examples of other possible arrangements of elements are shown in FIGS. 3A-3C. In FIGS. 3A-3C elements located on an upper or outer layer are shown as blank elements and elements located on a lower or inner layer are shown as hatched elements. As seen in FIG. 3A, a target 300 may be thrilled by placing second layer 114 upon first layer 104, such that second target structure 112 overlies first target structure 102 (FIGS. 2A and 2B). As seen in FIG. 3B, orientations of elements 120 and 130 in regions of the target area may be interchanged so as to form an additional target 302. As seen in FIG. 3C, yet an additional target 304 may be loaned in accordance with the illustrated arrangement, wherein elements 120 and 130 are distributed between four mutually non-uniformly sized regions of the target 304.

It is additionally appreciated that targets of the present invention are not limited to comprising two layers, as shown in FIGS. 1-3C. Rather, it is a particular advantage of the target design of the present invention that the target may comprise target structures located on more than two layers, such as on three or more consecutive layers, without necessitating an unacceptable reduction in size of ROIs 126.

An example of a triple layer target, constructed and operative in accordance with one preferred embodiment of the present invention, is illustrated in FIG. 4. As seen in FIG. 4, a target 400 may comprise a first target structure formed by first plurality of elements 120 on a first layer of a semiconductor device, a second target structure formed by second plurality of elements 130 on a second layer of the semiconductor device and a third target structure formed by a third plurality of elements 420 placed on a third consecutive layer of the semiconductor device. Uppermost lying elements 120 located on the upper or outer layer are shown as blank elements, intermediate lying elements 130 located on the middle layer are shown as striped hatch elements and lowest lying elements 420 located on the lower or innermost layer are shown as dotted elements in FIG. 4. As appreciated from consideration of FIG. 4, elements 420 of the third target structure are rotationally symmetric with respect to a third center of symmetry 422, which third center of symmetry is designed be axially aligned with the first and second centers of symmetry of the first and second target structures. The third target structure may generally resemble the first and second target structures in all other relevant aspects thereof.

It is appreciated that multi-layer targets such as target 400 may advantageously be used to simultaneously find misregistration between three or more layers of a semiconductor device, thus improving the efficiency and throughput of metrology performance.

As described hereinabove, the target design of the present invention is particularly well suited for use as a metrology target for high topography semiconductor stacks, where the need for a given separation between target features may preclude the use of periodic target structures. However, in certain embodiments of the present invention, it may be advantageous to form the target of the present invention by a combination of periodic elements in a target structure placed on one layer and unitary, non-periodic elements in a target structure placed on another consecutive layer.

Examples of such combined periodic and non-periodic target designs are shown in FIGS. 5A and 5B. In FIGS. 5A and 5B, target elements lying on an upper or outer layer are shown as blank elements and target elements lying on a lower or inner layer are shown as hatched elements, in order to distinguish therebetween.

As seen in FIG. 5A, a target 500 may be formed by a first target structure comprising first plurality of unitary, non-periodic elements 120 arranged on an upper or outer layer of a semiconductor device, as described hereinabove with reference to FIGS. 1-2B. However, the second target structure may be embodied as a second target structure 512 comprising a second plurality of periodic elements 520 arranged on a lower or inner layer of the semiconductor device. Each of periodic elements 520 may comprise a multiplicity of evenly spaced features and may be respectively located in at least four regions of the second target structure 512, second plurality of periodic elements 520 being rotationally symmetric with respect to a second center of symmetry 522. Second center of symmetry 522 is preferably designed to be axially aligned with the first center of symmetry of the first target structure and corresponding ones of second plurality of elements 520 are preferably located adjacent corresponding ones of first plurality of elements 120 in at least four regions of the target 500 area in a non-surrounding arrangement, when the upper and lower layers are fixedly placed one on top of another.

It is appreciated that such combined periodic and non-periodic target designs of the present invention may be optimized per layer, for compatibility to layer characteristics such as design rule and processing parameters, and that the target designs per layer may have different target qualities. It is further appreciated that the location of the centers of symmetry may be calculated using different algorithms per layer, based on the type of target structure employed in each layer.

As seen in FIG. 5A, first plurality of unitary, non-periodic elements 120 may be placed on an upper or outer layer, as indicated by blank elements 120. Second plurality of periodic elements 520 may be placed on an inner or lower layer, as indicated by hatched elements 520. As seen in FIG. 5B, the reverse is also possible, wherein second plurality of periodic elements 520 may be placed on an upper or outer layer, as indicated by blank elements 520, and first plurality of non-periodic elements 120 may be placed on an inner or lower layer, as indicated by hatched elements 120. It is appreciated that the inclusion in target 500 of additional layers including periodic or non-periodic target structures, as described above with reference to FIG. 4, is also possible.

It is thus understood that at least two target structures may be formed in accordance with any suitable arrangement at least of elements 120 and 130, Which elements may be a combination of periodic and non-periodic elements, provided that the respective centers of rotational symmetry of at least the first and second target structures are designed to be axially aligned when the layers upon which the target structures are formed are fixedly placed one upon another, with elements 120 and 130 being distributed between at least four regions of the target area and being located adjacent one another within the regions.

It is further understood that although in the illustrated embodiments adjacent ones of elements 120 and 130 within a given region are shown to be mutually parallel and elements of a given region are shown to be orthogonally orientated with respect to elements of a neighboring region, this is not necessarily the case.

Figure 6:
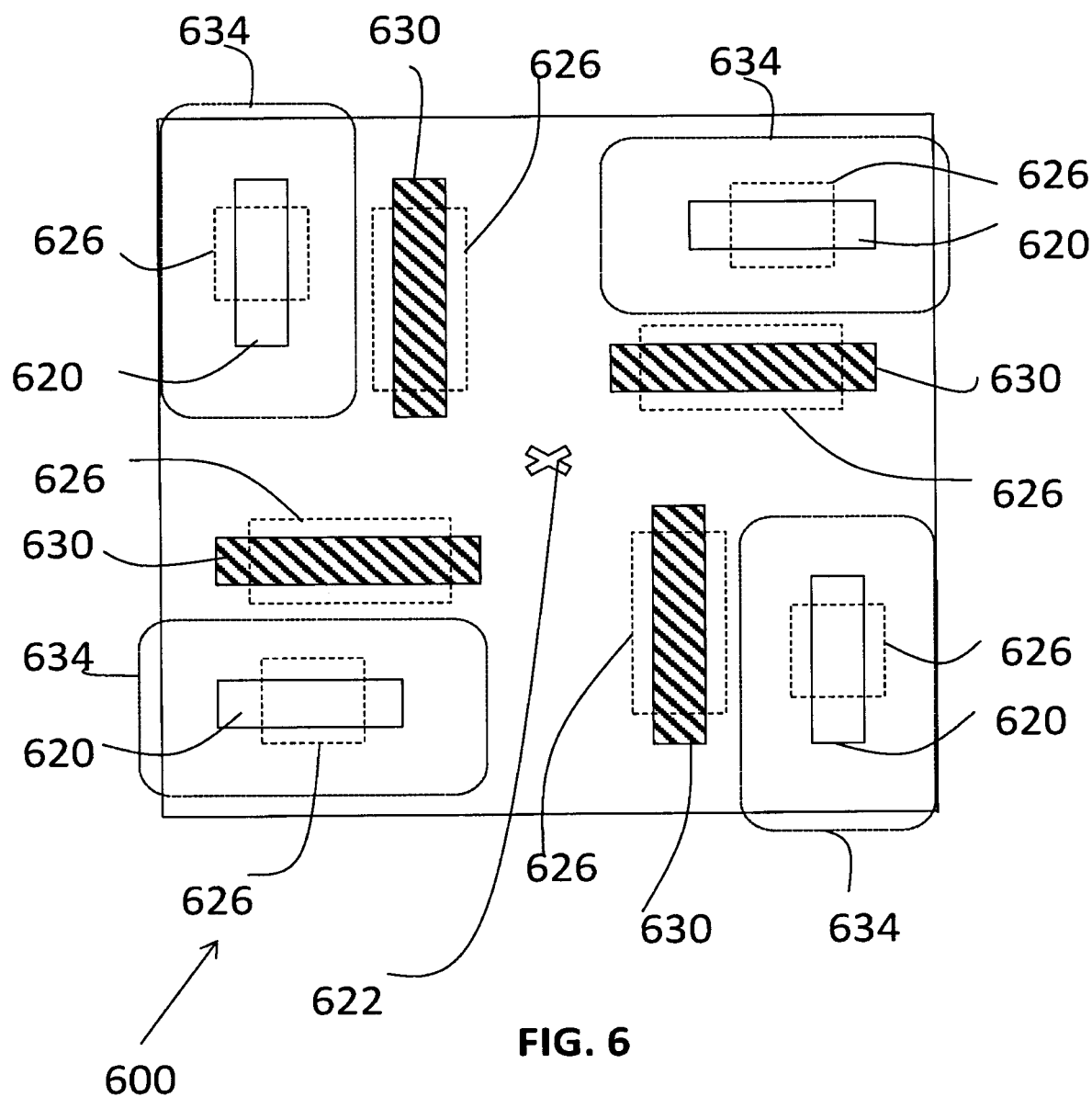
FIG. 6 is a simplified schematic top view illustration of yet an additional metrology target, constructed and operative in accordance with a still further preferred embodiment of the present invention.
Figure 7A:
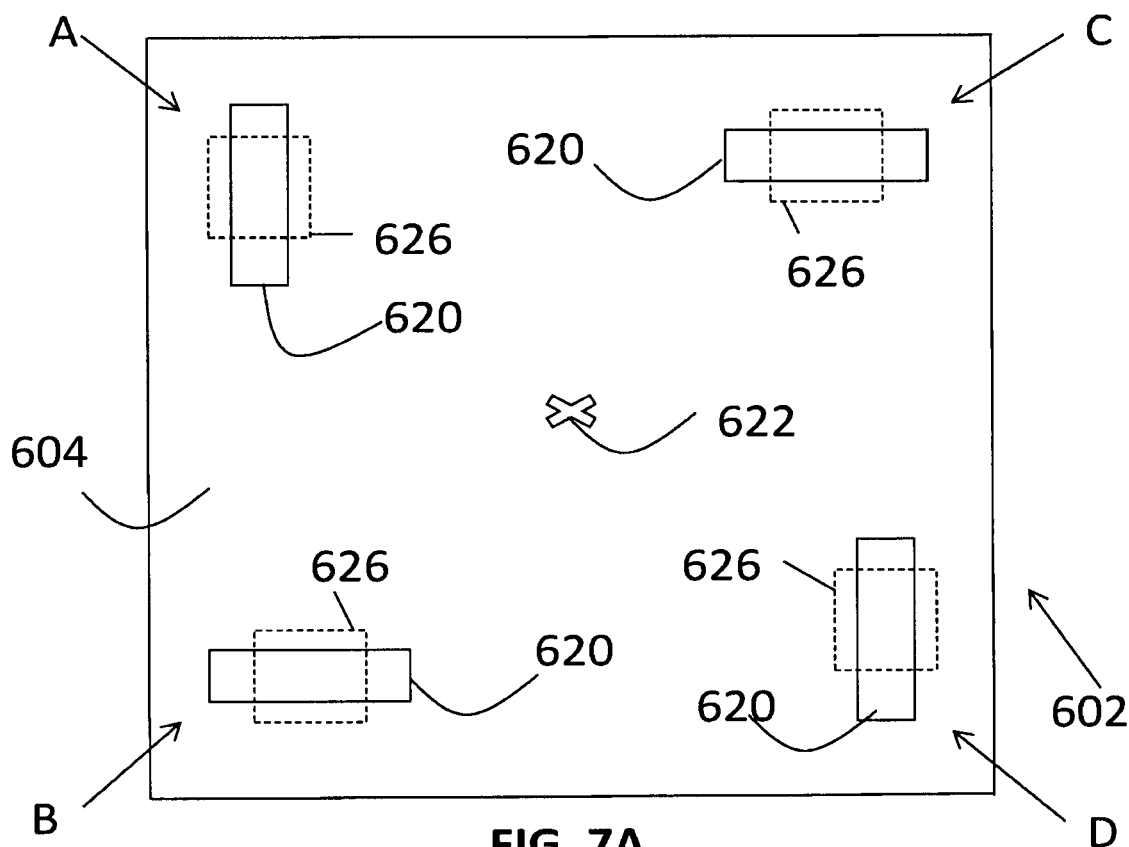
FIGS. 7A and 7B are simplified schematic top view illustrations of respective first and second target structures forming the metrology target of FIG. 6 when fixedly placed one upon another.
Figure 7B:
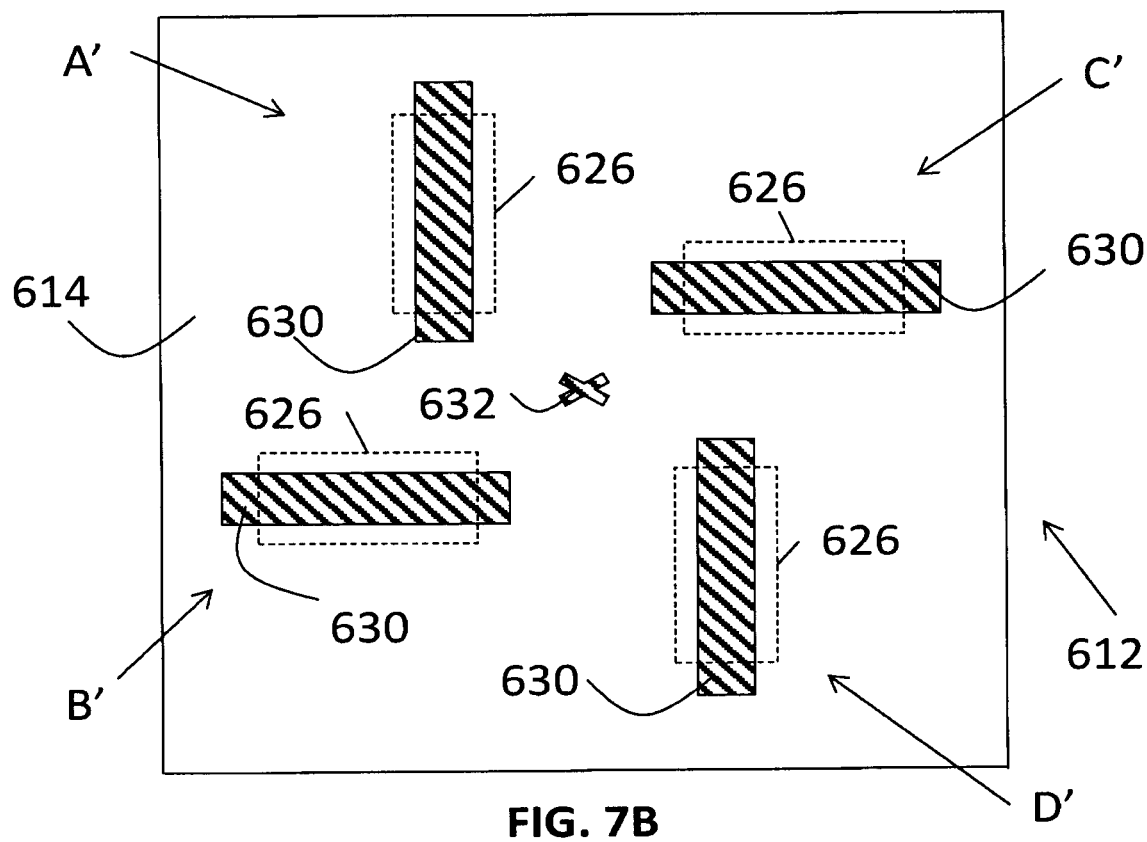

Reference is now made to FIG. 6, which is a simplified schematic top view illustration of a metrology target constructed and operative in accordance with another preferred embodiment of the present invention; and to FIGS. 7A and 7B, which are simplified schematic top view illustrations of respective first and second target structures forming the metrology target of FIG. 6 when placed one upon another.

As seen in FIGS. 6-7B, there is provided a metrology target 600, preferably including a first target structure 602 formed on a first layer 604 of a semiconductor device and at least a second target structure formed on at least a second layer of the semiconductor device, here embodied, by way of example, as a second target structure 612 formed on a second layer 614. FIG. 7A shows first target structure 602 formed on first layer 604 and FIG. 7B shows second target structure 612 formed on second layer 614. It is understood that the target 600 shown in FIG. 6 corresponds to the combined structure formed by first and second target structures 602 and 612 when first and second layers 604 and 614 are placed one upon the other. First layer 604 may be placed on second layer 614, such that first target structure 602 is disposed upon second target structure 612. Alternatively, second layer 614 may be placed on first layer 604, such that second target structure 612 is disposed upon first target structure 602. In the following description first layer 604 will be described as the upper layer disposed on second layer 614, although it is appreciated that the reverse is also possible.

Irrespective of the relative layered arrangement of first and second layers 604 and 614, the two layers 604 and 614 and hence the target structures 602 and 612 thereon are preferably disposed in a fixed position with respect to each other, such that metrology may be performed upon metrology target 600 in order to measure possible misregistration between layers 604 and 614, as is farther detailed henceforth. In accordance with a particularly preferred embodiment of the present invention, at least one and preferably both of first and second layers 604 and 614 are embodied as high or thick topography layers of a semiconductor device, metrology target 600 being particularly well suited for measuring misregistration between such layers due to various features thereof detailed henceforth.

Further in accordance with a particularly preferred embodiment of the present invention, first and second layers 604 and 614 are separated by an opaque or low transmission intervening layer (not shown), for example by a hardmask, such that target structures 612 disposed upon second layer 614 are not directly visible or are only poorly visible to a metrology tool when first layer 604 is disposed upon second layer 614. Additionally or alternatively, target structure 612 may be not directly visible or only poorly visible when first layer 604 is disposed upon second layer 614 due to the optical properties of first layer 604 itself. Notwithstanding that target structure 612 of second layer 614 is not directly visible when first layer 604 is placed upon second layer 614 to form target 600, target 600 may nonetheless be used as a metrology target for measuring misregistration between first and second layers 604 and 614, as is detailed henceforth.

First target structure 602 is preferably formed by a first plurality of elements 620 preferably having second order rotational symmetry with respect to a first rotational center of symmetry 622. Elements 620 are preferably unitary, non-periodic elements, here shown to each have a bar-like shape. Preferably, each of elements 620 has a length dimension greater than a width dimension thereof. Each of elements 620 preferably in itself possesses at least second order rotational symmetry, such that each element 120 is invariant upon 180° rotation thereof. Elements 620 are preferably located in at least four regions of target structure 602, here indicated as regions A, B, C and D. A measurement region of interest (ROI) 626 may be defined with respect to each of elements 620. ROI 626 corresponds to the region associated with each element 620 over which a signal is measured for the purpose of metrology. It is appreciated that ROIs 626 may be manually defined by a user of the metrology tool used to perform metrology on target 600 or may be automatically defined by algorithms, possibly including machine learning algorithms.

Second target structure 612 is preferably formed by a second plurality of elements 630 preferably having second order rotational symmetry with respect to a second rotational center of symmetry 632. Elements 630 are here shown, by way of example only, as unitary, non-periodic elements, having a bar-like shape, although it is appreciated that elements 630 may alternatively be periodic elements, as is described hereinabove with reference to FIGS. 5A and 5B. Preferably, each of elements 630 has a length dimension greater than a width dimension thereof. Each of elements 630 preferably in itself possesses at least second order rotational symmetry, such that each element 630 is invariant upon 180° rotation thereof. Elements 630 are preferably located in at least four regions of target structure 612, here indicated as regions A', B', C' and D'. Measurement ROIs 626 may additionally be defined with respect to each of elements 630.

In order to prevent mixing of signals measured over ROIs 626 associated with first target structure 602 with signals measured over ROIs 626 associated with second target structure 612, elements 620 are preferably somewhat shorter than elements 630 in order to better separate the signals arising therefrom. The spread of signal arising from elements 620 is schematically illustrated in FIG. 6 as an extended region 634 surrounding each of elements 620. It is appreciated, however, that depending on the signal spread due to the topography of first and/or second layers 604 and 614 this difference in size between elements 620 and 630 may not be necessary. Furthermore, regions A, B, C, D and A', B', C' and D' are preferably, although not necessarily, mutually uniformly sized.

First and second target structures 602 and 612 may be produced on respective layers 604 and 614 by any suitable patterning techniques, such as by lithography. An example of a lithography tool suitable for producing first and second target structures 602 and 612 on layers of a semiconductor device is a TWINSCAN deep ultraviolet (DUV) immersion lithography system, commercially available from ASML of Veldhoven, Netherlands. Any convenient orientation of first and second target structures 602 and 612 relative to the placement of dies on layers 604 and 614 may be chosen, with that orientation, being maintained from layer to layer. By way of example, target structures 602 and 612 may be located within the scribe line between dies and/or within dies.

As seen in FIG. 6, target 600 is formed when first and second layers 604 and 614 are placed one upon another, for example when first layer 604 is placed upon second layer 614. Uppermost elements 620 located on first layer 604 are shown as blank elements and lower elements 630 located on second layer 614 are shown as hatched elements, in order to distinguish between elements 620 and 630 residing on different layers. As mentioned hereinabove, elements 630 located on second layer 614 may not be directly visible to a metrology tool performing measurements on target 600.

When first and second layers 604 and 614 are placed one upon another, first and second centers of symmetry 622 and 632 are designed to be in axial alignment, such that first and second centers of symmetry 622 and 632 lie along a common axis generally orthogonal to a direction of layering of first and second layers 604 and 614 and to a direction of measurement. Furthermore, corresponding ones of plurality of elements 620 are preferably located adjacent to but not surrounding corresponding ones of plurality of elements 630 in the at least four regions of each of the first and second target structures 602 and 612. As seen in FIG. 6, by way of example, when first layer 604 is placed upon second layer 614 in perfect alignment, centers of symmetry 622 and 632 axially coincide. Additionally, regions A, A'; B, B'; C, C' and D, D' each respectively overlap, such that element 620 located in region A is located adjacent to element 630 located in region A', element 620 located in region B is located adjacent to element 630 located in region B' and so forth, elements 620 being in a non-surrounding arrangement with respect to elements 630 when viewed from a direction generally orthogonal to the direction of layering of layers 604 and 614.

In the performance of metrology on a semiconductor device including metrology target 600, metrology target 600 is preferably imaged by a metrology tool. An example of a metrology tool suited for the imaging of metrology target 600 is an Archer optical imaging metrology tool, commercially available from KLA of California, USA. It is appreciated however, that targets of the present invention may be imaged by any sui table optical metrology tool operating within a wavelength range of approximately 350-2,500 nm.

The metrology tool is preferably operative to measure signals arising from each ROI 626 associated with each of elements 620 and 630 and to find misregistration between layers 604 and 614 of the semiconductor device based on measurement of misregistration between target structures 602 and 612. The metrology tool may be operative to perform measurements on upper and lower consecutive layers simultaneously or consecutively. The metrology tool may further be operative to simultaneously perform measurements on multiple one of the targets of the present invention in the field of view thereof. The metrology tool may additionally or alternatively be operative to combine misregistration data obtained based on measurements of multiple ones of the targets of the present invention, in order to improve estimation of the total measurement uncertainty (TMU).

It is appreciated that multiple ones of the targets of the present invention located on a semiconductor wafer may differ with respect to each other across the semiconductor wafer or across a field of the semiconductor wafer. For example, multiple ones of the target of the present invention may differ with respect to each other across the wafer or field of the wafer in terms of the design or dimensions thereof. Furthermore, a group or collection of targets of the present invention having mutually different dimensions or other characteristics may be located on a semiconductor wafer in close proximity to each other, in order to improve measurement of misregistration based thereon. For example, misregistration measurements derived based on metrology performed on a group of closely spaced mutually differently sized targets of the present invention may be more robust and accurate than misregistration measurements derived based on a single target or group of identical targets.

It is appreciated that, the metrology tool may perform metrology with different settings per layer as well as different settings per direction of target, such as vertical and horizontal directions. Examples of different metrology settings that may be applied per layer and/or per target direction include different wavelength of illumination, different polarization of illumination, different focus, different illumination NA and different collection NA.

Particularly preferably, misregistration between target structures 602 and 612 may be ascertained based on an offset between the derived location of first and second centers of symmetry 622 and 632. As mentioned hereinabove, first and second centers of symmetry 622 and 632 are designed to be mutually axially aligned When first and second layers 604 and 614 are properly disposed with respect to each other, such that any offset in the relative positions of first and second centers of symmetry 622 and 632 is indicative of misregistration between first and second target structures 602 and 612 and by extension between first and second layers 604 and 614.

Due to second target structure 612 not being directly visible or being only poorly visible to a metrology tool, as mentioned hereinabove, the location of second center of symmetry 632 cannot be readily directly derived based on measurements of signal arising from second target structure 612. Rather, the location of the second center of symmetry 632 is preferably derived based on induced topography, meaning that topographic effects in the region of elements 630 on underlying layer 614 create corresponding topographic effects on an opaque or poorly transmissive layer thereabove and further corresponding topographic effects on upper layer 604. These corresponding topographic effects are preferably self-aligned between the various layers, such that signals arising from induced topographic effects on layer 604 represent the topography of elements 630 on layer 614 therebeneath and thus may be used as a basis for finding center of symmetry 632 of elements 630 themselves. It is understood that, in the embodiment of the invention shown in FIGS. 6-7B, metrology is thus not directly performed upon elements 630 but rather upon overlying topographical features induced by the presence of elements 630 therebeneath.

Methods for the ascertaining of misregistration based on offset between centers of symmetry of target patterns are well known in the art and may be applied to the metrology targets of the present invention by one skilled in the art.

It is appreciated that the formation of each of target structures 602 and 612 from a plurality of individual elements distributed between various regions thereof in mutually non-surrounding arrangement provides high coverage of the target area defined by target 600. This allows signal to be measured by the metrology tool over a significantly sized combined ROI formed of ROIs 626 for each target structure, leading to an improved signal-to-noise (SNR) ratio in the metrology output.

Elements 620 and 630 may be arranged to allow good coverage by ROIs 626 of the target area without causing mixing of signals arising from ROIs 626 of first and second target structures 602 and 612. Such mixing of signals would lead to inaccuracies in the misregistration measurements derived based on target 600. This is in contrast to conventional target structures, such as a Box-in-Box and Bar-in-Bar target designs in which an inner box-like target structure formed on one layer is concentrically surrounded by an outer box-like target structure formed on another consecutive layer. In such target designs, in order to maintain signal isolation between signals arising from ROIs associated with the different layers, the inner box-like target structure is typically reduced in size, leading to a reduction in the ROI associated therewith and corresponding reduction in signal measured therefrom. Advantageously, no such trade-off is required in the present invention, since a relatively large ROI coverage of the target structure of each layer may be maintained without causing signal mixing therebetween. This is particularly advantageous for high topography stacks, where such signal mixing may otherwise significantly degrade the accuracy of misregistration measurements, due to the high topography of the various layers. By way of example, this may be particularly advantageous for layers having topographical features of height greater than 4 um or greater than 5 um.

Furthermore, in contrast to the conventional Box-in-Box target design in which the inner target box is required to be, concentrically surrounded by the outer target box, in the target design of the present invention elements 620 of first target structure 602 do not completely surround elements 630 of second target structure 612. The target design of the present invention thus allows greater flexibility in the relative layout of elements 620 and 630. This is particularly advantageous for high topography stacks, in which each of plurality of elements 620 and 630 may be required to be themselves separated by a given minimum separation. Similarly, the target design of the present invention is advantageous in this sense over periodic targets, such as conventional Advanced Imaging Metrology (AIM) targets. Since target elements formed on high topography layers may require mutual separation by a minimum distance, such conventional periodic targets are typically poorly suited for formation on such high topography layers, as the periodic features thereof cannot be formed with the required periodicity.

Preferably, the arrangement of elements 620 and 630 of first and second target structures 602 and 612 respectively, allows for the separate calculation of the center of symmetry in horizontal and vertical directions for each of first and second target structures 602 and 612. Any errors in ascertainment of the location of the center of symmetry in one direction, for example in the vertical direction, thus do not influence the ascertainment of the location of the center of symmetry in another direction, for example in the horizontal direction. This is in contrast to certain conventional metrology targets formed by two-dimensional features formed on consecutive layers and located in opposite diagonals of the target area when the layers are placed one upon another, for which conventional targets centers of symmetry in both directions are simultaneously ascertained and errors in one direction thus affect errors in the other direction.

Figure 8:
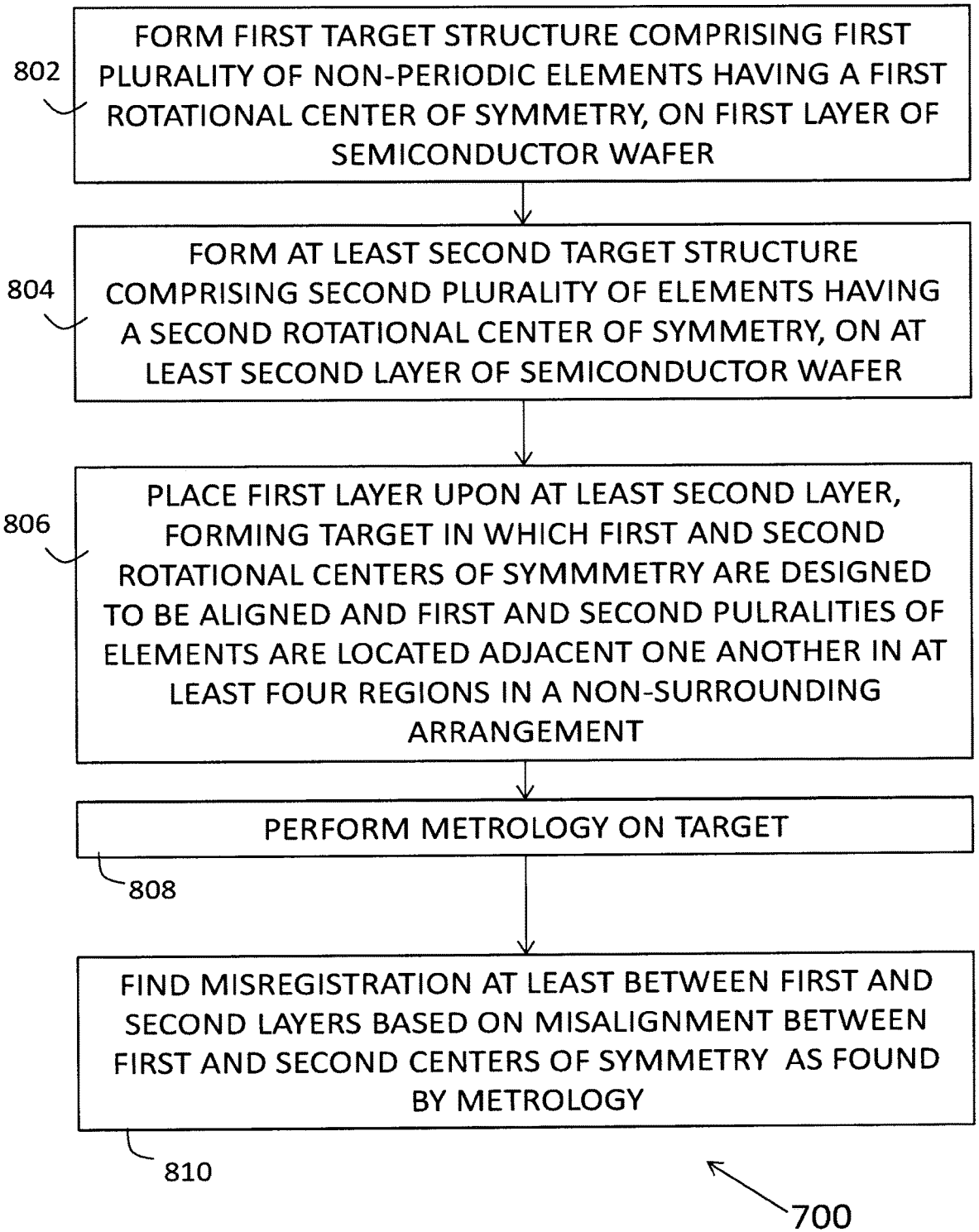
FIG. 8 is a simplified flow chart showing steps involved in the measurement of misregistration between layers of a semiconductor device based on utilizing a metrology target of any one of the types shown in FIGS. 1-7B.

Reference is now made to FIG. 8, which is a simplified flow chart showing steps involved in the measurement of misregistration between layers of a semiconductor device based on utilizing a metrology target of any one of the types shown in FIGS. 1-7B.

As seen in FIG. 8, a method 800 for the measurement of misregistration may begin at a first step 802, whereat a first target structure comprising a first plurality of non-periodic elements is formed on a first layer of a semiconductor wafer. The first plurality of non-periodic elements is preferably arranged so as to have second order rotational symmetry with respect to a first center of symmetry. As seen at a second step 804, a second target structure comprising a second plurality of elements is preferably formed on a second layer of the semiconductor wafer. The second plurality of elements is preferably arranged on the second layer so as to have second order rotational symmetry with respect to a second center of symmetry.

As seen at a third step 806, first and second layers are preferably disposed one upon the other. At third step 806, by way of example, the first layer is described as being placed upon the second layer although it is appreciated that the reverse is also possible. Notwithstanding the relative order of placement of first and second layers, first and second layers are preferably disposed one upon another in such a configuration that the first and second centers of rotational symmetry are designed to be axially aligned. Furthermore, the first and second pluralities of elements of the mutually layered target structures are located adjacent one another in at least four regions of each target structure in a non-surrounding arrangement.

It is appreciated that although first-third steps 802, 804 and 806 are shown and described as being consecutively performed, this is not necessarily the case. First-third steps 802-806 may be re-ordered, far example with second layer being placed upon first layer, as described at third step 806, prior to the formation of a second target structure thereon, as described at second step 804.

As seen at a fourth step 808, metrology measurements are preferably performed on the target formed at third step 806. Particularly, preferably, metrology measurements are performed in order to ascertain possible misalignment between the first and second centers of rotational symmetry, which are designed to be in axial alignment but for misregistration between the layers inducing misalignment therebetween, as seen at a fifth step 810.

It is appreciated that in the case that the target involves target structures formed on more than two layers, such as target structures formed on three layers, method 800 may be repeated as necessary in order to find possible misregistration between all of the various layers upon which the target is formed.

It will be appreciated by persons skilled in the art that the present invention is not limited to what has been particularly shown and described hereinabove. The scope of the present invention includes both combinations and subcombinations of various features described hereinabove as well as modifications thereof, all of which are not in the prior art.

The invention claimed is:

1. A metrology target for use in measuring misregistration between layers of a semiconductor device comprising:
   a first target structure placed on a first layer of a semiconductor device, said first target structure comprising a first plurality of unitary elements respectively located in at least four regions of said first target structure, said first plurality of elements being rotationally symmetric with respect to a first center of symmetry; and
   at least a second target structure placed on at least a second layer of said semiconductor device, said second target structure comprising a second plurality of elements respectively located in at least four regions of said second target structure, said second plurality of elements being rotationally symmetric with respect to a second center of symmetry,
   said second center of symmetry being designed to be axially aligned with said first center of symmetry and corresponding ones of said second plurality of elements being located adjacent corresponding ones of said first plurality of elements in said at least four regions in a non-surrounding arrangement, when said first and second layers are placed one on top of another, wherein a plurality of measurement regions of interest are defined such that one of the plurality of measurement regions of interest is defined with respect to each of said first plurality of elements and second plurality of elements, and wherein a length along a long dimension of said first plurality of elements is shorter than a length along a long dimension of said second plurality of elements.

2. The metrology target according to claim 1, wherein said first plurality of unitary elements comprises non-periodic elements.

3. The metrology target according to claim 1, wherein said second plurality of elements comprises unitary, non-periodic elements.

4. The metrology target according to claim 1, wherein said first and second pluralities of elements comprise bar-like elements, each having a length dimension greater than a width dimension.

5. The metrology target according to claim 4, wherein each element of said first and second pluralities of elements is invariant upon 180° rotation thereof.

6. The metrology target according to claim 4, wherein said length dimension and said width dimension of said first plurality of elements are similar to said length dimension and said width dimension of said second plurality of elements.

7. The metrology target according to claim 1, wherein said second plurality of elements comprises periodic elements.

8. The metrology target according to claim 1, and also comprising:
   a third target structure placed on a third layer of said semiconductor device, said third target structure comprising a third plurality of elements respectively located in at least four regions of said third target structure, said third plurality of elements being rotationally symmetric with respect to a third center of symmetry,
   said third center of symmetry being designed to be aligned with said first and second centers of symmetry and corresponding ones of said third plurality of elements being located adjacent corresponding ones of said first and second pluralities of elements in said at least four regions in a non-surrounding arrangement, when said first, second and third layers are placed one on top of another.

9. The metrology target according to claim 1, wherein said four regions of said first target structure and said second target structure are mutually uniformly sized.

10. The metrology target according to claim 1, wherein said four regions of said first target structure and said second target structure are not mutually uniformly sized.

11. A method for measuring misregistration between layers of a semiconductor device comprising:
   providing a first target structure on a first layer of a semiconductor device, said first target structure comprising a first plurality of unitary elements respectively located in at least four regions of said first target structure, said first plurality of elements being rotationally symmetric with respect to a first center of symmetry;
   providing at least a second target structure placed on at least a second layer of said semiconductor device, said second target structure comprising a second plurality of elements respectively located in at least four regions of said second target structure, said second plurality of elements being rotationally symmetric with respect to a second center of symmetry;
   placing said first and second layers one upon another, such that said second center of symmetry is designed to be axially aligned with said first center of symmetry and corresponding ones of said second plurality of elements are located adjacent corresponding ones of said first plurality of elements in said at least four regions in a non-surrounding arrangement, wherein a plurality of measurement regions of interest are defined such that one of the plurality of measurement regions of interest is defined with respect to each of said first plurality of elements and second plurality of elements, and wherein a length along a long dimension of said first plurality of elements is shorter than a length along a long dimension of said second plurality of elements; and performing metrology on said first and second target structures, in order to measure misregistration between said first and second layers.

12. The method according to claim 11, wherein said first plurality of unitary elements comprises non-periodic elements.

13. The method according to claim 11, wherein said second plurality of elements comprises unitary, non-periodic elements.

14. The method according to claim 11, wherein said first and second pluralities of elements comprise bar-like elements, each having a length dimension greater than a width dimension.

15. The method according to claim 14, wherein each element of said first and second pluralities of elements is invariant upon 180° rotation thereof.

16. The method according to claim 14, wherein said length dimension and said width dimension of said first plurality of elements is similar to said length dimension and said width dimension of said second plurality of elements.

17. The method according to claim 11, wherein said second plurality of elements comprises periodic elements.

18. The method according to claim 11, and also comprising:

providing a third target structure on a third layer of said semiconductor device, said third target structure comprising a third plurality of elements respectively located in at least four regions of said third target structure, said third plurality of elements being rotationally symmetric with respect to a third center of symmetry, and placing said third layer upon said first and second layers such that said third center of symmetry is designed to be aligned with said first and second centers of symmetry and corresponding ones of said third plurality of elements are located adjacent corresponding ones of said first and second pluralities of elements in said at least four regions in a non-surrounding arrangement.

19. The method according to claim 11, wherein said four regions of said first target structure and said second target structure are mutually uniformly sized.

20. The method according to claim 11, wherein said four regions of said first target structure and said second target structure are not mutually uniformly sized.

* * * * *